United States Patent [19]

Higashiyama

[11] Patent Number: 5,107,298
[45] Date of Patent: Apr. 21, 1992

[54] IMAGE TRANSFERRING METHOD

[75] Inventor: Shunichi Higashiyama, Yokkaichi, Japan

[73] Assignee: Brother Kogyo Kabushiki Kaisha, Nagoya, Japan

[21] Appl. No.: 557,027

[22] Filed: Jul. 25, 1990

[30] Foreign Application Priority Data

Aug. 11, 1989 [JP] Japan .................................. 1-208955

[51] Int. Cl.$^5$ ............................................. G03B 27/32
[52] U.S. Cl. ...................................................... 355/77
[58] Field of Search ........................... 355/27, 28, 77; 430/138, 256, 257, 258, 262, 263

[56] References Cited

U.S. PATENT DOCUMENTS

| | | | |
|---|---|---|---|
| 4,766,053 | 8/1988 | Shinozaki et al. | 430/256 |
| 4,841,338 | 6/1989 | Suzuki | 355/27 |
| 4,877,712 | 10/1989 | Namiki et al. | 430/262 |

FOREIGN PATENT DOCUMENTS 0226655 7/1988 Japan .................................. 430/256

1-206092 8/1989 Japan .

Primary Examiner—L. T. Hix
Assistant Examiner—Khanh Dang
Attorney, Agent, or Firm—Oliff & Berridge

[57] ABSTRACT

An image transferring method for transferring a developer agent layer having a visible image from a developing medium comprising a substrate and the developer agent layer on the substrate to a heat sealing sheet comprising a sheet substrate and a thermoplastic resin layer on the sheet substrate, is disclosed. The method comprises the steps of superposing the developing medium over the heat sealing sheet while the developer agent layer is contacted with the thermoplastic resin layer, supplying the superposed developing medium and the heat sealing sheet with heat and pressure to attach the developer agent layer to the heat sealing sheet through the thermoplastic resin layer, and exfoliating the substrate from the developing medium attached to the heat sealing sheet while fixing the sheet substrate of the heat sealing sheet to a flat or curved surface.

11 Claims, 3 Drawing Sheets

IMAGE TRANSFERRING METHOD

BACKGROUND OF THE INVENTION

This invention relates to a method for transferring a developing layer having a visible image thereon from a developing medium to a heat sealing sheet.

There has been conventionally known an image forming apparatus using a photosensitive and pressure-sensitive recording medium coated with microcapsules mainly encapsulating dye precursor, photocurable resin and photopolymerization initiator and a developing sheet coated with developer agent capable of reacting with the dye precursor to color the dye precursor. In this type of image forming apparatus, as described in Japanese Unexamined Published Patent Application No. 61-173981, the photosensitive and pressure-sensitive recording medium is exposed to light in accordance with an image information to photocure the photocurable resin encapsulated in the microcapsules, and then is superposed over the developing sheet under pressure to thereby rupture those microcapsules which have not been exposed to light. As a result, the dye precursor issued from the ruptured microcapsules is reacted with the developer agent on the developing sheet to be colored, that is, a color image is formed on the developing sheet.

In this type of image forming apparatus, however, a color image can be formed on a specifically-produced sheet such as a developing sheet coated with the developer agent, but can not be formed on any kind of an image supporting medium such as a plain paper such as a post card, cloth, plastic film or the like. If it is daringly tried to form a color image on the medium such as a post card, cloth or the like, it is required to paste the developing medium having the color image thereon on the medium after the color image is formed on the developing medium. In this case, the image supporting medium on which the color image is finally supported is more increased in thickness and weight. This is inconvenient for a practical use.

In view of the above disadvantage, the applicant of this application has proposed the following method for forming a color image on an image supporting medium such as a post card, cloth, a plastic film or the like, as described in Japanese Patent Application No. 63-31455. In this method are used two types of image forming media, one of which comprises a developing medium having a substrate and a developer agent layer (image forming layer) on which a color image is formed, and the other of which comprises a heat sealing sheet including a sheet substrate and a thermoplastic resin layer coated on the sheet substrate. Both the surfaces of the developing medium having the developer agent layer containing the color image thereon and the thermoplastic resin layer of the heat sealing sheet are contacted with each other and supplied with heat and pressure, so that the developing medium is attached to the heat sealing sheet with thermoplasticity of the thermoplastic resin. After being cooled substrate of the developing medium is exfoliated from the developing medium attached to the heat sealing sheet. As a result, only the developer agent layer (image forming layer) is transferred to the heat sealing sheet. Thereafter, the heat sealing sheet to which the image forming layer is transferred is attached to an image supporting medium such as a post card, cloth, plastic film or the like, whereby a color image is finally supported on any kind of medium such as the post card, cloth, plastic film or the like.

In this method, in addition to the image forming layer, the heat sealing sheet is also attached to the image supporting medium, so that flexibility of the image supporting medium is degraded due to the attachment of the sheet substrate thereto. Such a degradation of flexibility of the image supporting medium restricts the types of the image supporting medium to be used. For example, cloth which is required to be flexible can not be used as an image supporting medium in such a method. In order to overcome such a disadvantage, in Japanese Patent Application No. 63-147805, Japanese Utility Model Application No. 63-84914 and Japanese Utility Model Application No. 63-84915, there has been proposed a method in which the sheet substrate of the heat sealing sheet is also exfoliated from the image supporting medium in consideration of the relationship in adhesion among the sheet substrate of the heat sealing sheet, the thermoplastic resin, the developer agent layer (image forming layer), and the image supporting medium. This method has the same process for transferring the image forming layer from the developing medium to the heat sealing sheet as that of the foregoing method.

However, when the substrate of the developing medium is a paper, it is difficult to separate only the substrate from the developing medium which is attached to the heat sealing sheet with heat and pressure. For example, there is a possibility that the separation is not made between the substrate and the developer agent layer of the developing medium, but between the sheet substrate and the thermoplastic resin layer of the heat sealing sheet due to the relationship between the adhesions thereof.

SUMMARY OF THE INVENTION

An object of this invention is to provide a method for completely transferring only a developer agent layer (image forming layer) from a developing medium to a heat sealing sheet while the separation between a sheet substrate and a thermoplastic resin layer of the heat sealing sheet is completely prevented.

In order to attain the above object, an image transferring method for transferring a developer agent layer having a visible image thereon from a developing medium comprising a substrate and the developer agent layer on the substrate to a heat sealing sheet comprising a sheet substrate and a thermoplastic resin layer on the sheet substrate, comprises the steps of superposing the developing medium over the heat sealing sheet while the developer agent layer is contacted with the thermoplastic resin layer, supplying the superposed developing medium and the heat sealing sheet with heat and pressure to attach the developer agent layer to the heat sealing sheet through the thermoplastic resin layer, and exfoliating the substrate from the developing medium attached to the heat sealing sheet while fixing the sheet substrate of the heat sealing sheet to a flat or curved surface.

DETAILED DESCRIPTION OF THE INVENTION

A preferred embodiment of this invention will be described hereunder with reference to the accompanying drawings.

Figure 1:
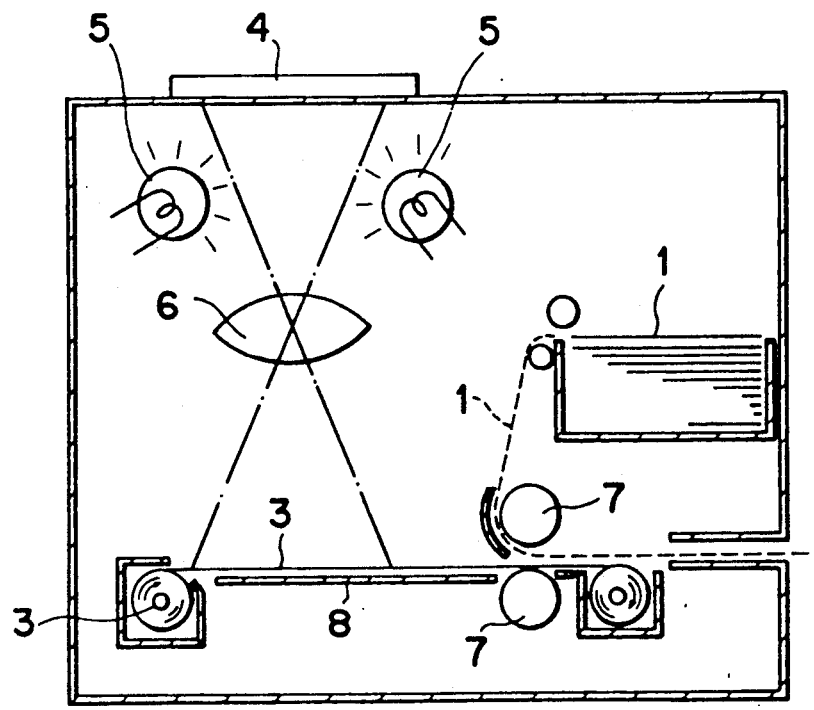
FIG. 1 is a schematic view of the arrangement of an image forming apparatus to which the method of this invention is applied.
Figure 2:
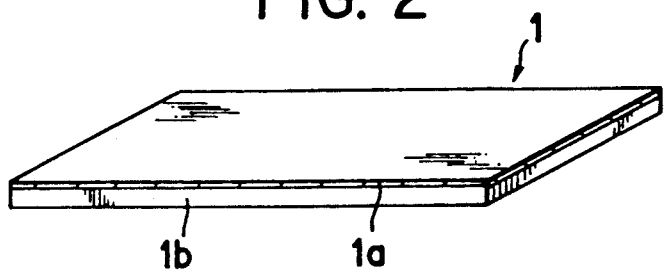
FIG. 2 is a perspective view of an embodiment of the developing medium.

FIG. 1 is a schematic view of the overall arrangement of a color image forming apparatus to which the method of this invention is applied.

This apparatus includes a cartridge for accommodating a roll type of photosensitive and pressure-sensitive recording medium 3 on which microcapsules encapsulating dye precursor, photosensitive material and so on are carried, an exposure unit 5 for irradiating an original 4 to light and exposing the light reflected from the original 4 to the photosensitive and pressure-sensitive recording medium 3 to form a latent image on the photosensitive and pressure-sensitive recording medium 3, a take-up roller for winding up the exposed photosensitive and pressure-sensitive recording medium 3, a cassette for accommodating a stack of developing media 1 each of which is coated on developer agent capable of reacting with the dye precursor to color the dye precursor, and a pair of pressure-developing rollers 7. In this apparatus, the photosensitive and pressure-sensitive recording medium 3 which is drawn out of the cartridge is fed to an exposure stand 8 to be subjected to an exposure process, so that a latent image is formed on the medium 3. Thereafter, the photosensitive and pressure-sensitive recording medium 3 is superposed over the developing medium 1 while the microcapsule-coated surface of the medium 3 and the developer agent-coated surface of the medium 1 are contacted with each other, and supplied with pressure by the pressure-developing rollers 7 to thereby develop the latent image on the photosensitive and pressure-sensitive recording medium 3 into a visible image on the developing medium 1.

The developing medium 1 of this invention comprises a substrate 1b and a developer agent layer 1a laminated on the substrate 1b. The substrate 1b is preferably formed of glassine, arto paper, or coated paper which has a relatively highly smooth surface, and the developer agent layer 1a is preferably formed of a thermoplastic binder and phenol compounds such as p-phenyl phenol, or aromatic carboxylic acid compounds such as salicylic acid, gallic acid, and propyltannic acid, which are mixed suitably with the binder. A receiver sheet (developing sheet) which is produced as Cycolor by THE MEAD CORPORATION may be used as the developing medium. In any case, the developing medium may be formed of a sheet coated with granular developer agent which is mixed with a binder in so suitable amount that the coloring is not prevented.

Figure 3:
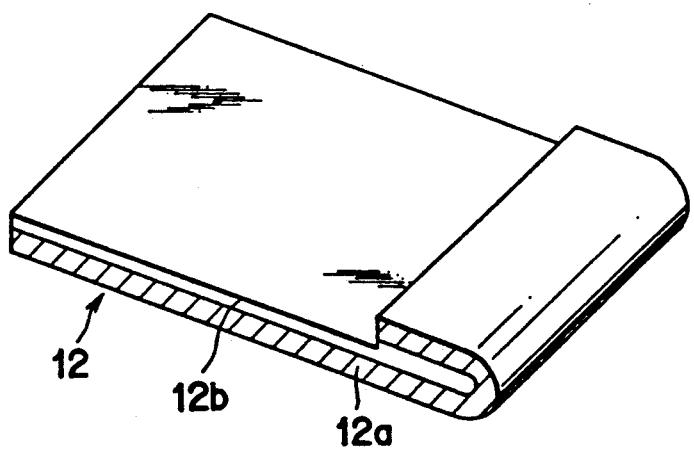
FIG. 3 is a perspective view of an embodiment of the heat sealing sheet.
Figure 4:
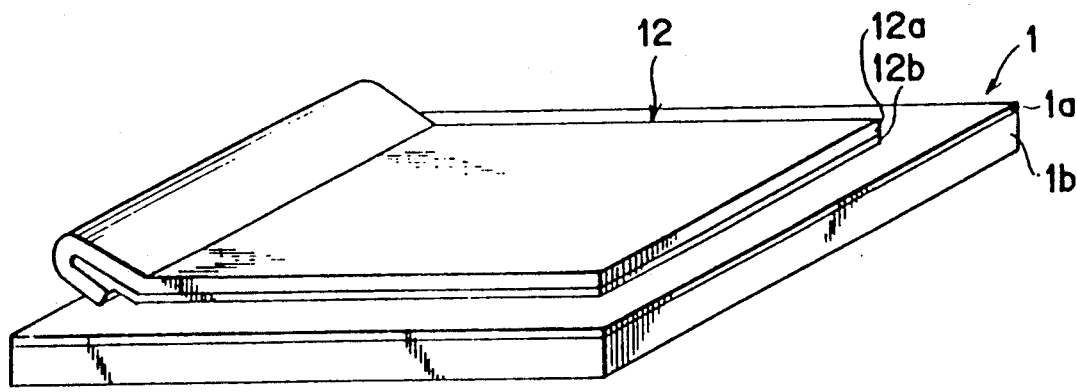
FIG. 4 shows a superposed state of the developing medium and the heat sealing sheet.
Figure 5:
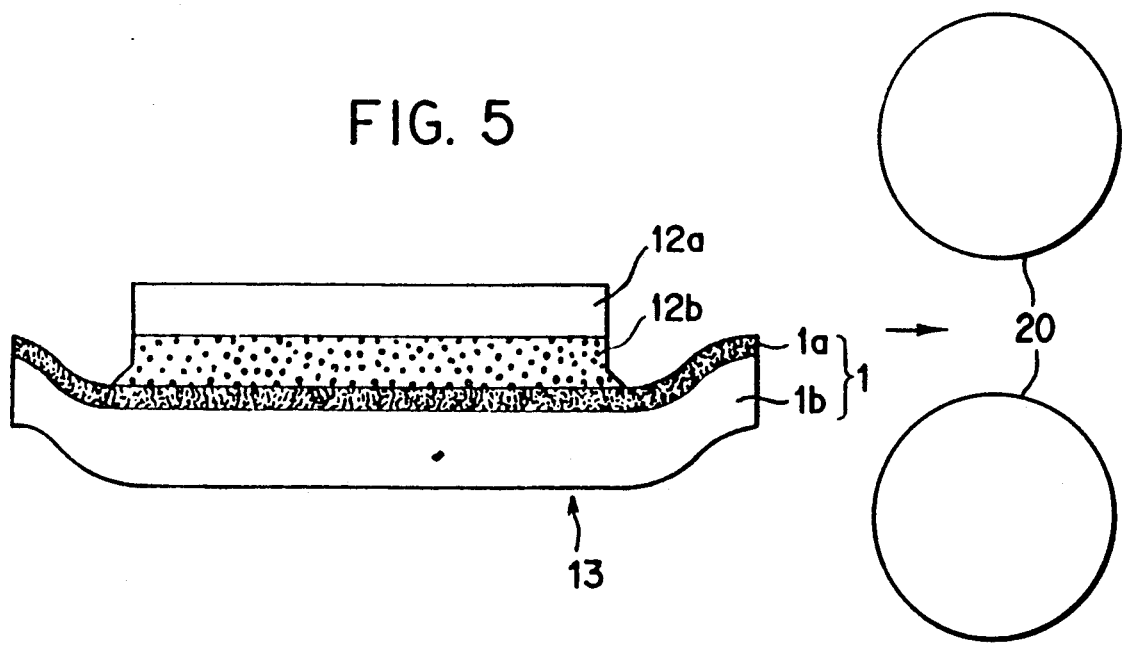
FIG. 5 is a enlarged cross-sectional view of the developing medium having the heat sealing sheet to which the image transferring method of this invention is applied.

As shown in FIG. 3, the heat sealing sheet 12 comprises a sheet substrate 12a and a transparent thermoplastic resin layer 12b laminated on the sheet substrate 12a. The sheet substrate 12a may be formed of any kind of material such as plastic film, paper or the like insofar as it is not deformed by a heat/pressure roller as described hereinafter. Of any materials, a polyethylene terephthalate film is preferably used. The thermoplastic resin layer 12b may be formed of vinyl resin such as ethylene/vinyl acetate copolymer, rosin ester, vinyl alcohol/vinyl acetate copolymer, vinyl alkylether/maleic anhydride copolymer, polyvinyl chloride, vinyl chloride/vinyl acetate copolymer or the like, acrylic resin such as poly(ethyl acrylate), poly(buthyl methacrylate), poly(methyl cyanoacrylate), or the like, styrene resin, polyamide resin or wax.

In this embodiment, a polyethylene terephthalate film is used as the sheet substrate 12a of the heat sealing sheet 12, and a mixture of 10 wt. % emulsion of ethylene/vinyl acetate copolymer, 10 wt. % emulsion of wax and 2 wt. % emulsion of rosin ester is used as the thermoplastic resin. The thermoplastic resin layer 12b is formed by coating the thermoplastic resin on the sheet substrate 12a with a #12 bar coater (not shown), and then drying it with hot air for 60 seconds at 120° C. within an oven. In this coating process of the thermoplastic resin layer 12b on the sheet substrate 12a, one end portion of the sheet substrate 12a is folded as shown in FIG. 3, so that the thermoplastic resin layer 12b contacted with the sheet substrate 12a is placed face up, except for the end portion. That is, the sheet substrate 12a is U-shaped at the end portion thereof and the termoplasctic resin layer 12b is sandwitched between the U-shaped sheet substrate 12a. Accordingly, the surface of the sheet substrate at the end portion has no adhesive property. This end portion is used to fix the heat sealing sheet 12 to a flat or curved surface when the substrate 1b of the developing medium 1 is exfoliated from the developing medium.

A process of transferring a visible image on the developing medium 1 to the heat sealing sheet 12 will be described hereunder with reference to FIGS. 4 to 7.

At a first stage, the surface of the thermoplastic resin layer 12b of the heat sealing sheet 12 and the surface face of the developer agent layer 1a of the developing medium on which the visible image has been formed are superposed over each other such that the whole surface of the heat sealing sheet 12 is covered with the surface of the developing medium 1, and supplied with heat and pressure in a gap between heating pressure rollers 20 which are heated to approximately 140° C. to allow the developing medium 1 to thermally adhere to the heat sealing sheet 12. These attached medium and sheet are cooled, and a developing medium 13 having a heat sealing medium is formed.

Figure 6:
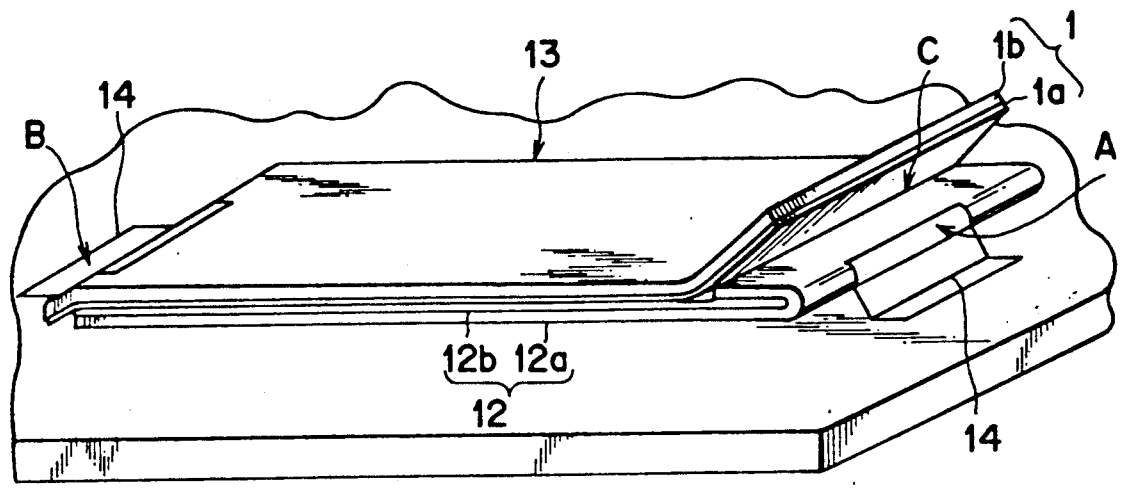
FIG. 6 is a perspective view of the developing medium having the heat sealing sheet which is fixed to the flat surface.

At a next stage, the developing medium 13 having the heat sealing sheet 12 is fixed on a flat surface (plate) such that the sheet substrate 12a of the heat sealing sheet 12 is contacted with the flat surface. Various fixing manners for fixing the developing medium 13 on the flat surface may be used in this invention. In this embodiment, a fixing manner of fixing the developing medium 13 using an adhesive tape 14 as shown in FIG. 6 is used. A fixed portion A as shown in FIG. 6 corresponds to one end portion of the sheet substrate 12a which is folded in the process for attaching the sheet substrate to the thermoplastic resin layer, and the heat sealing sheet 12 is fixed to the flat surface with the adhesive tape 14. The thermoplastic resin layer is not exposed at this end portion. The substrate 1b of the developing medium 1 is also fixed to the flat surface with the adhesive tape 14 to form another fixed portion B as shown in FIG. 6.

Figure 7:
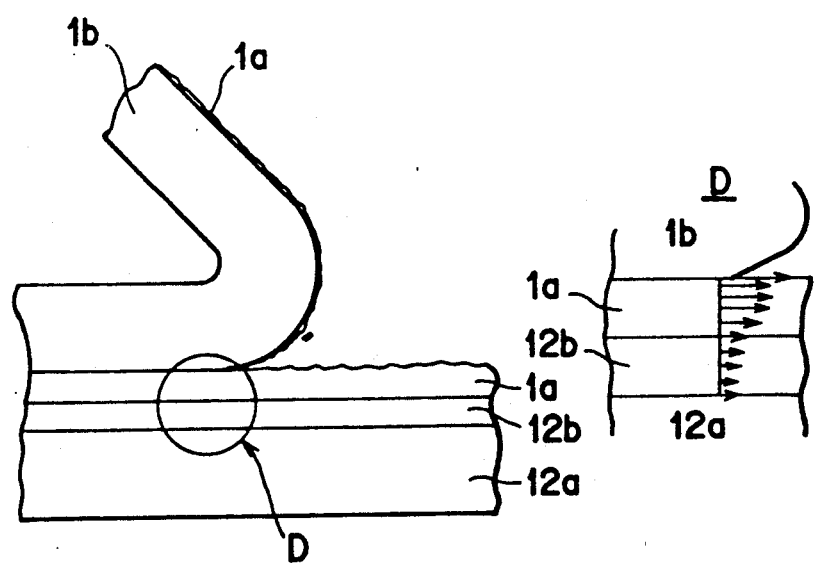
FIG. 7 shows a dynamic relationship when the substrate is exfoliated.

Thereafter, a portion C of the developing medium 1 is pulled forward of the fixed portion B while being grasped by a hand or other mechanical means, thereby exfoliating the substrate 1b from the developing medium 1. FIG. 7 is a cross-sectional view of the developing medium 13 having the heat sealing sheet which is taken in a longitudinal direction thereof, and shows a dynamical relationship between the elements shown in FIG. 7 when the substrate is exfoliated from the developing medium.

In the above exfoliating step, separation arises at an interface between the developer agent layer 1a and the substrate 1b which is provided with the strongest shearing stress. When granular developer agent is used, aggregation of particles of the developer agent is broken up at the interface because adhesion between the particles is weak. In any case, the developer agent layer having the visible image is easily transferred from the developing medium 13 to the heat sealing sheet 12.

In this embodiment, the sheet substrate of the heat sealing sheet is fixed on the flat surface (plate), however, may be fixed to a curved surface (plate). Further, any member on which the sheet substrate is fixed may be used insofar as it has a flat or curved surface.

Further, the heat sealing sheet 12 may be intentionally designed such that separation arises at an interface between the sheet substrate 12a and the thermoplastic resin layer 12b. In this case, the heat sealing sheet 12 to which the developer agent layer 1a of this invention is transferred is attached to an image supporting medium and then the sheet substrate 12a is exfoliated from the heat sealing sheet 12. This case is most favorite for an image supporting medium formed of cloth.

As described above, according to this invention, the substrate is easily exfoliated from the developing medium having the heat sealing sheet to thereby transfer only the developer agent layer (image forming layer) to the heat sealing sheet. The heat sealing sheet to which the developer agent layer is transferred can be attached to the image supporting medium such as paper, plastic film, cloth or the like. Therefore, a value of the image supporting medium is increased.

What is claimed is:

1. An image transferring method for transferring a developer agent layer having a visible image from a developing medium comprising a substrate and the developer agent layer on the substrate to a heat sealing sheet comprising a sheet substrate and a thermoplastic resin layer on the sheet, comprising the steps of:
   temporarily fixing one end portion of the heat sealing sheet to a flat or curved surface;
   superposing the developing medium over the heat sealing sheet such that the developer agent layer is contacted with the thermoplastic resin layer at a whole portion except said one end portion of the heat sealing sheet;
   supplying the superposed developing medium and the heat-sealing sheet with heat and pressure to attach the developer agent layer to the heat sealing sheet through the thermoplastic resin layer; and
   exfoliating the substrate from the developing medium attached to the heat sealing sheet.

2. The image transferring method as claimed in claim 1, wherein said temporarily fixing step comprises the step of temporarily fixing the one end portion of the heat sealing sheet to the flat or curved surface with adhesive tape.

3. An image transferring method as claimed in claim 1, further comprising the steps of, before superposing the developing medium over the heat sealing sheet, laminating the thermoplastic resin layer on the sheet substrate and folding one end portion of the sheet substrate such that the thermoplastic resin layer is sandwitched between the folded sheet substrate.

4. An image transferring method as claimed in claim 3, wherein said exfoliating step comprises the steps of fixing the one end portion of the sheet substrate to the flat or curved surface with adhesive tape, and pulling the substrate of the developing medium forward of the other portion of the sheet substrate to exfoliate the substrate from the developing medium.

5. The image transferring method as claimed in claim 1, further comprising temporarily fixing to the flat or curved surface one end portion of the developing medium which confronts a second end portion of the heat sealing sheet.

6. The image transferring method as claimed in claim 1, wherein the heat sealing sheet has a U-shaped folded portion at the one end portion thereof, the U-shaped folded portion comprising a U-shaped sheet substrate and thermoplastic resin layer filled in an inner space thereof.

7. The image transferring method as claimed in claim 6, wherein said temporarily fixing step comprises temporarily fixing the U-shaped folded sheet substrate to the flat or curved surface with adhesive tape.

8. An image transferring method for transferring a developer agent layer having a visible image from a developing medium comprising a substrate and the developer agent layer on the substrate to a heat sealing sheet comprising a sheet substrate and a thermoplastic resin layer on the sheet, the heat sealing sheet having a folded end portion, comprising the steps of:
   superposing the developing medium over the heat sealing sheet such that the developer agent layer is contacted with the thermoplastic resin layer at a whole portion except the folded end portion of the heat sealing sheet;
   supplying the superposed developing medium and the heat sealing sheet with heat and pressure to attach the developer agent layer to the heat sealing sheet through the thermoplastic resin layer; and
   exfoliating the substrate from the developing medium attached to the heat sealing sheet while temporarily fixing the folded end portion of the heat sealing sheet to a flat or curved surface.

9. The image transferring method as claimed in claim 8, wherein said temporarily fixing step includes temporarily fixing said end portion to said flat or curved surface with an adhesive tape.

10. The image transferring method as claimed in claim 8, further comprising the steps of, before superposing the developing medium over the heat sealing sheet, laminating the thermoplastic resin layer on the sheet substrate and folding one end portion of the sheet substrate such that the thermoplastic resin layer is sandwitched between the folded sheet substrate.

11. The image transferring method as claimed in claim 10, wherein said exfoliating step comprises the steps of fixing the end portion of the sheet substrate to the flat or curved surface with adhesive tape, and pulling the substrate of the developing medium forward of the other portion of the sheet substrate to exfoliate the substrate from the developing medium.

* * * * *